United States Patent [19]

Akatsu

[11] Patent Number: 5,717,635
[45] Date of Patent: Feb. 10, 1998

[54] HIGH DENSITY EEPROM FOR SOLID STATE FILE

[75] Inventor: Hiroyuki Akatsu, Westchester County, N.Y.

[73] Assignee: International Business Machines Corporation, Armonk, N.Y.

[21] Appl. No.: 703,833

[22] Filed: Aug. 27, 1996

[51] Int. Cl.⁶ .................................................. H07L 29/68
[52] U.S. Cl. .................. 365/185.05; 365/185.11; 365/185.12; 257/314; 257/315; 257/319
[58] Field of Search .................... 365/185.05, 185.06, 365/185.11, 185.12; 257/315, 316, 317, 318, 314, 319

[56] References Cited

U.S. PATENT DOCUMENTS

| | | | |
|---|---|---|---|
| 4,375,087 | 2/1983 | Wanlass | 365/218 |
| 4,379,343 | 4/1983 | Moyer | 365/104 |
| 4,398,338 | 8/1983 | Tickle et al. | |
| 4,435,790 | 3/1984 | Tickle et al. | 365/218 |
| 4,875,188 | 10/1989 | Jungroth | 365/148 |
| 5,243,559 | 9/1993 | Murai | 365/218 |
| 5,295,107 | 3/1994 | Okazawa et al. | 365/218 |
| 5,313,086 | 5/1994 | Jinbo | 257/355 |
| 5,361,235 | 11/1994 | Kodama | 36/218 |
| 5,379,253 | 1/1995 | Bergemont | 257/321 |
| 5,523,969 | 6/1996 | Okazawa | 257/316 |
| 5,554,867 | 9/1996 | Ajika et al. | 365/185.05 |

FOREIGN PATENT DOCUMENTS 2240969  9/1990  Japan.

OTHER PUBLICATIONS

"An Asymmetrical Offset Source/Drain Structure for Virtual Ground Array Flash Memory with Dinor Operation" M. Ohi et al.; LSI Laboratory, Mitsubishi Electric Corp.; Japan; pp. 57–58.

*Primary Examiner*—David C. Nelms
*Assistant Examiner*—Vu A. Le
*Attorney, Agent, or Firm*—Whitham, Curtis, Whitham & McGinn; Alison Mortinger, Esq.

[57] ABSTRACT

An EEPROM of NOR-type architecture is formed at high integration density and allows selective programming without selective production of hot electron currents in storage transistor channels. common transistor channel conductors are formed as n-wells running parallel to bit lines having a width of minimum lithographic feature size and separated by shallow trench isolation structures. Connections from bit lines and the n-wells to respective transistors is formed by sub-lithographic metal plugs formed in a self-aligned manner to sidewalls of a layered structure including floating gates and a control gate/word line conductor. Thus a cell size only slightly greater than four times the minimum lithographic feature size can be produced. Provision of a transistor connecting a bit line and an associated n-well unconditionally prevents hot electron current concentration in the gate oxide to increase durability during both programming and flash erasure to either logical state. Programming in combination with erasure to either logical state further doubles memory cell durability.

12 Claims, 5 Drawing Sheets

STAND-BY

READ

HIGH TO LOW

LOW TO HIGH

HIGH DENSITY EEPROM FOR SOLID STATE FILE

BACKGROUND OF THE INVENTION

1. Field of the Invention

The present invention generally relates to electrically erasable programmable read only memories (EEPROMs) and, more particularly, to high density EEPROM structures and EEPROM operational modes which are adapted to emulate high speed magnetic storage devices.

2. Description of the Prior Art

Basic computer functions must be supported by storage devices from which data and instructions for processing may be retrieved and into which results of such processing may be stored. A single data processor may be supported by a plurality of different memory devices depending on the required speed of access and storage operations and the storage capacity required. For example, a processor in a so-called personal computer may be directly supported by extremely high speed random access memory (RAM) and read only memory (ROM), each of relatively small capacity, and a mass storage device such as a so-called hard disk which is relatively slow in comparison with RAM and ROM but of very large capacity. Generally, the cost of storage (on a "per bit" basis) is inversely proportional to the speed of access and numerous caching schemes have been developed to effectively simulate larger amounts of very high speed memory by allowing transfer of blocks of data or instructions from a slower storage device of large capacity to another storage device from which the data or instructions may be fetched more rapidly when needed by the processor.

It also generally follows that the greater the capacity of the storage device, the less frequently data is changed. For example, once loaded into a mass storage device, only a very small number of files of an application program may ever be altered and then relatively infrequently. For example, setup files for customization of an application program may only be altered once, if at all, over the life of the application program. Very few files in an application will be altered with greater frequency than temporary back-up files. Thus, the majority of the storage capacity of a mass storage may function as ROM. However, the capacity to change files must generally be provided if only to allow loading of desired applications programs.

While hard disks and floppy disks have been the storage medium of choice for small data processors and are extremely reliable at the present state of the art, such devices rely on physical movement of the storage medium and the mechanism used to produce such movement is subject to wear and damage from accelerations such as from vibration or impact. Further, the magnetic storage medium, itself, is subject to damage from contact with the heads used to read the magnetic domains on the medium, particularly when subjected to accelerations, or by particles which may become deposited thereon or jammed between the magnetic medium and the heads.

The development of portable computers and particularly so-called notebook and pen computers has led to the use of computers in environments such as being hand-held or in moving vehicles in which they may be subjected to accelerations such as impacts or vibration. Even when not in use, the portability of such devices will typically subject them to accelerations and other environmental conditions which can cause damage to the storage medium. Therefore, there has been substantial interest in the development of alternative storage devices to provide mass storage with reduced likelihood of damage to the mass storage device or storage medium. A solid state storage medium would, of course, avoid the issue of physical damage, wear and contamination of mechanical parts altogether with the additional potential for reduction of physical size.

However, some very basic and practical differences have hampered the development of suitable solid state storage devices for emulation of magnetic storage media. A most basic issue is that of data volatility. While random access memories may be of either the static or dynamic type, both must be continuously powered in order to maintain data stored therein. Between the static and dynamic types of RAM, dynamic RAMs, while of relatively high capacity (e.g. having a small number of electrical elements per memory cell) must be continually refreshed at relatively high frequency. Static RAMs require many more elements per bit of storage to avoid the need to be periodically refreshed and are thus largely impractical for mass storage.

Another issue is the requirement for alterability of stored data. Both types of RAM use substantial amounts of chip space to provide access to each bit of storage. This leads to substantial inefficiency in a large memory in which any particular address is accessed, on average, only infrequently. By comparison, conceptually, a magnetic storage is much more efficient since the same structure is used to access all addresses on the medium. Read only memories are unsuitable for mass storage since stored bits cannot be altered.

One known structure which might be considered to meet at least the two criteria discussed above is the so-called bubble memory which is non-volatile when power is removed and achieves movement of magnetic domains without moving mechanical parts while using a common structure for reading any address. The difficulty with bubble memories, however, is relatively limited storage capacity (e.g. a few kilobits per chip) and the fact that all stored data potentially must be circulated past the read/write structure for access to a particular address, leading to potentially extended worst case access times which are unacceptable in comparison with those for currently available hard disks.

Numerous structures for so-called programmable read only memories (PROMs) are known and which are adapted to be relatively non-volatile (although some small amount of stand-by power may be needed) and to have data altered relatively infrequently while offering high speed of access to an arbitrary address. While early PROM designs relied on non-electrical effects (e.g. irradiation with ultraviolet light) to change stored data, recent designs have allowed erasure and writing to be accomplished electrically and without external devices. Such programmable memories are known as electrically erasable programmable read only memories (EEPROMs).

In EEPROMs, data is stored as charge on a floating gate within a field effect transistor. The floating gate (FG) is insulated from all other structures and has charge placed (e.g. written) thereon by electron tunnelling effects (e.g. channel hot electron (CHE) injection, Fowler-Nordheim injection, etc.) to or from the substrate in response to a field generated by a voltage on a control gate (CG), usually implemented as a word line (WL), overlying the floating gate. However, such tunnelling phenomena cause degradation of the insulation of the floating gate, depending on the conditions under which tunnelling takes place.

For example, channel hot electron injection is achieved by placing a voltage (e.g. 5 volts) across the transistor sufficient to generate a hot electrons in the channel thereof while a voltage (e.g. 12 volts) on the control gate causes some electrons from the hot electron current to be injected through a dielectric into the floating gate. Development of the current can be selectively done in some EEPROM architectures where no other mechanism of selectivity is possible. Writing can generally be accomplished in relatively short time (approximately 1 μsec.) by the hot electron injection. However, the high currents required for channel hot electron (CHE) injection limit the number of cells which can be concurrently written within the capacities of practical power supplies and power dissipation facilities. This results in a slow programming rate.

In contrast, Fowler-Nordheim (FN) tunnelling requires a higher voltage on the control electrode to achieve injection but no current in the transistor channel is required. However, unique selectability of the control gates is required and writing speed is significantly lower (about 10 μsec.) than for CHE injection. Nevertheless, parallel concurrent writing can be performed to the limits of selectivity available in the particular EEPROM design within normal power supply capacity since no channel hot electron current is required.

Erase operation has to be done with FN tunnelling since it involves the removal of electrons from the floating gate which cannot be facilitated by a channel current. However, the way to apply the voltage during the erase operation affects the degree of tunnel dielectric degradation. In the conventional NOR type arrays (and DINOR arrays which will be described below) electrons in the floating gate are pulled out by applying a high positive voltage to the source while the substrate or well is pulled to ground and the drain is floating. Under such conditions, the large voltage difference between the source and substrate produces hot holes created by band-to-band tunnelling in the source area. Since oxide is extremely fragile against hole injection, erasure by FN tunneling by this mechanism accelerates gate dielectric degradation.

On the contrary, in NAND type arrays, the substrate or well voltage is raised to a high voltage for erasure while the word lines are held at ground. The voltage applied to the substrate is also applied to the source and drain and hot holes are not produced. Therefore, this operation can increase the tunnel dielectric endurance in comparison with the above-described operation in NOR and DINOR arrays. The same voltage is also applied to the source, drain and substrate during the program or write operation in NAND type arrays further increasing dielectric endurance.

It should be understood that other arrangements can achieve writing or erasure and that the same electron injection mechanism need not be used and often cannot be used for both writing and erasure. For example, as described above, channel hot electron injection may be used only for the write operation but Fowler-Nordheim tunnelling may be possible for flash erasure since selectivity is not required for flash erasure. Nevertheless, it should be noted that placing charge on the floating gate could correspond to either writing or erasure, as could removal of charge therefrom and the particular mechanism utilized must accommodate the need for selectivity in writing or erasure although "writing" or "programming" is generally used to connote placing electrons on the floating gate and "erasing" is generally used to connote removal of electrons from the floating gate.

Performance of EEPROMs has been enhanced by providing for common or flash erasure of ranges of addresses prior to rewriting, as alluded to above. Such memories are known as flash EEPROMs. Flash EEPROMS also allow some structural advantages favoring increased integration density since common connections may be used which do not allow selectivity for an erase operation. On the other hand, durability of the memory cells may be compromised since non-selective erasure implies that data must be rewritten even when no change of state of a particular memory cell is required. However, while storage capacities of such devices has increased in recent years, the cost per bit of storage has remained relatively high and storage capacity has remained far too low for successful emulation of a hard disk or other mass storage structure without utilizing a large number of chips. Further, access and cycle time for write operations in most currently available EEPROMs is far too slow for emulation of currently available hard disks. For example, the data burst transfer rate of a typical hard disk for personal computers is up to a 200 ns cycle (5 MB/sec. to 20 MB/sec., depending on bus width) with a latency on the order of a few milliseconds. Writing speeds of EEPROMS are also reduced by the need to verify that storage of charge has taken place and that stored data can be read. Additionally, if a solid-state mass memory or so-called solid-state file (SSF) can be provided, it is also desirable, due to the complexity of caching schemes, for the processor to be able to read portions of the SSF in a time comparable to access to DRAM for access to instructions for processing in a cycle time comparable to the processing execution speed (e.g. currently less than seventy nanoseconds).

Additionally, as alluded to above, since EEPROMs rely on tunnelling effects by any of several known mechanisms such as channel hot electron (CHE) tunnelling and Fowler-Nordheim tunnelling and operation near the breakdown voltage, the number of write operations prior to failure due to insulator degradation has been limited and not comparable to magnetic media. That is, each write or erase operation involving a change of stored data causes a small but finite amount of damage to a dielectric layer (so-called tunnel dielectric) adjacent a floating gate on which charge is stored, forming so-called traps in which electrons can collect and causing charge leakage and reduced breakdown voltage. Effects of repeated write and erase operations are cumulative and the breakdown voltage may be reduced suddenly below the operating voltage of the system; causing failure and loss of data in a memory cell and usually rendering the entire chip unusable. That is, a high number of write/erase cycles of a single cell or relatively few cells of an EEPROM may compromise the reliability of the entire chip.

In attempting to improve various aspects of EEPROM performance which are of relevance to emulation of a mass storage medium, often referred to as a solid-state file, several trade-offs have been recognized in the art to which a solution has not been previously found. Specifically, several aspects of performance and integration density are dependent on the architecture chosen for the EEPROM and the associated driving/addressing circuits. At the present time, there are two basic architectures for EEPROM memory cell arrays referred to as NOR-type and NAND-type, respectively, in accordance with the logic function used for addressing which, of course, must complement the internal organization and interconnection of the memory cells.

The NOR-type of architecture generally has storage transistors arranged in pairs with the drains of respective transistors of a pair connected to a bit line (BL). The control gates are formed by respective word lines (WL) for respective transistors of each pair of transistors. The word lines generally run orthogonally to the bit lines. Since the bit line is located above or on the substrate surface, a contact must be made to the diffused drain region of the transistor. Such contacts are generally larger in lateral dimensions than the width of the bit lines or the potential spacing of word lines and thus imposes a limitation on integration density which can be achieved.

The sources of transistors of each pair in a NOR-type EEPROM are commonly connected to a conductor formed by a diffused impurity region of the substrate, together with the sources of all pairs of transistors corresponding to a particular pair of word lines. While the diffused impurity region does not require a contact or space on the substrate surface within the array, lateral spacing from the word lines is necessary to avoid effects of voltages placed thereon. The required lateral spacing must also include a margin for manufacturing tolerances to avoid overlap of the word lines with the diffused impurity connector.

This commonly connected diffused connector is of low resistance and allows rapid reading of a NOR-type EEPROM. However, the common connection also prevents use of tunnelling effects such as Fowler-Nordheim tunnelling which do not provide for other mechanisms engendering selectivity, as does CHE injection.

The NAND-type EEPROM structure is typically formed with an architecture including a plurality of series-connected memory cell structures. This architecture does not require formation of contacts for each pair of transistors but only for a single bit line connection for each series connected transistor string; each transistor corresponding to a separate word line. All bit lines are typically terminated in a common source line outside the memory cell array. Likewise, the series connection avoids the need for a common connection of transistor pairs as formed in the NOR-type EEPROM. The common connection can be electrically separated during the write operation by using the array select transistors which are located between each array and the common connection for the arrays. Therefore, the NAND-type EEPROM lends itself to much higher integration densities while maintaining full selectivity but at a cost of reduced reading speed due to the higher resistance of the series connected transistors. Writing speed is also effectively impaired since transistors must be written sequentially along a bit line using connection, writing and blocking voltages on the word lines to control the series-connected transistors. Thus selective writing in a massively parallel fashion cannot be used to increase effective speed sufficiently in a NOR-type EEPROM architecture to emulate current magnetic media.

Accordingly, for solid-state emulation of a mass storage device, a need has long existed for a storage structure having a large storage capacity at low cost and capable of rapid access and adequately durability over a large number of write/erase operations before failure. This need has been particularly intractable since Fowler-Nordheim tunnelling and known NOR-type EEPROM architectures are mutually exclusive. Further, for all its other potential advantages, known NOR-type flash EEPROM architectures have required layouts which prevent the necessary integration density to provide the required memory capacity with a reasonable number of chips.

There is one proposal for the array architecture which utilizes FN injection for both write and erase operations in a NOR-type array, referred to in the art as a DINOR array. However, as mentioned above, the voltage condition used in the erase operation in a DINOR array causes hole injection and the cell endurance cannot be as great as that of a NAND array.

In addition to hard disk replacement, a SSF using an EEPROM or flash EEPROM may be used as a memory device to store execution codes or data which is required by the processor because of its fast read access time. The read access time of a NOR type array is normally comparable to that of a DRAM. Therefore, the processor can call a specific address to get execution codes or data needed dynamically without first loading those signals in DRAM. This operation is called direct execution of SSF or a direct execution option. NAND type arrays require a longer time for such an access and cannot be efficiently used for such direct execution applications.

In summary, a new type of EEPROM capable of performing all the following functions has not previously been achieved in the art:

1. Utilization of the same voltage on the substrate, sources and drains of cell transistors during FN injection for both write and erase operations to suppress hot hole injection and prolong the number of write/erase cycles available from a cell;

2. fast write operation rate equalling or exceeding that of current hard disks by utilizing FN injection for concurrent write operations over many cells within bounds of reasonable power consumption;

3. small cell size to reduce cost per bit to meet storage requirements for mass storage at a cost competitive with hard disks; and 4. a fast read operation comparable to DRAMs to support direct execution type operations to save the time for data transfer to DRAM, requiring the use of a NOR type array.

SUMMARY OF THE INVENTION

It is therefore an object of the present invention to provide an EEPROM structure capable of being manufactured at extremely high integration density.

It is another object of the invention to provide an EEPROM structure capable of reliably performing all write/erase operations which could reasonably be anticipated prior to obsolescence of the processor which it supports (in excess of five years).

It is a further object of the invention to provide an EEPROM structure capable of, over a reasonable number of chips, to provide storage capacity and access time for write operations comparable to a currently available hard disk.

It is yet another object of the invention to provide an EEPROM capable of very fast read operations comparable to a DRAM to enable direct execution mode operation.

It is yet another object of the invention to provide a memory operation methodologies which further enhance durability of a memory structure over an increased number of write/erase cycles.

In order to accomplish these and other objects of the invention, an electrically erasable programmable read only memory (EEPROM) is provided comprising a substrate, a plurality of elongated conductors formed within the substrate at a surface thereof, a plurality of layered gate structures extending orthogonally to the elongated conductors, the layered structures including a floating gate at an intersection of the layered structure with one of the elongated conductors and a control gate electrode overlying but insulated from each floating gate, the layered structure thus defining a memory transistor at each intersection, and a bit line overlying the layered structure and extending in the direction of the elongated conductors.

In accordance with another aspect of the invention, a method for programming an EEPROM including the steps, in sequence, of changing the logical states of a selected memory cell from a first logical state to a second logical state in accordance with data, changing logical states of all cells of a partition of the EEPROM to a second logical state, changing the logical states of a selected memory cell from a second logical state to a first logical state in accordance with data, and changing logical states of all cells of a partition of the EEPROM to a first logical state.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
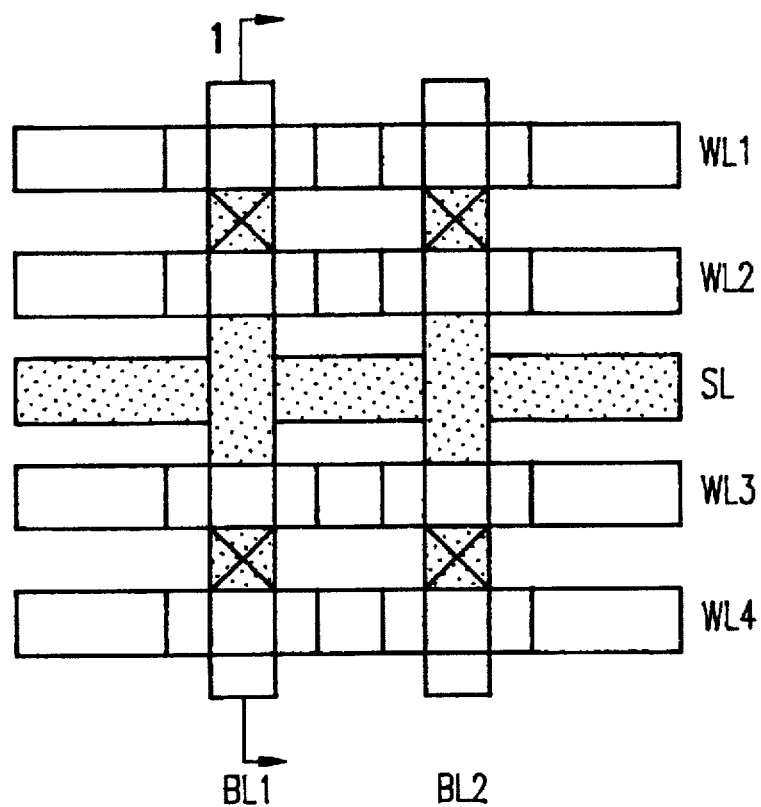
FIGS. 1A and 1C are plan views of exemplary layouts of known NOR-type and NAND-type EEPROMs, respectively.
Figure 1B:
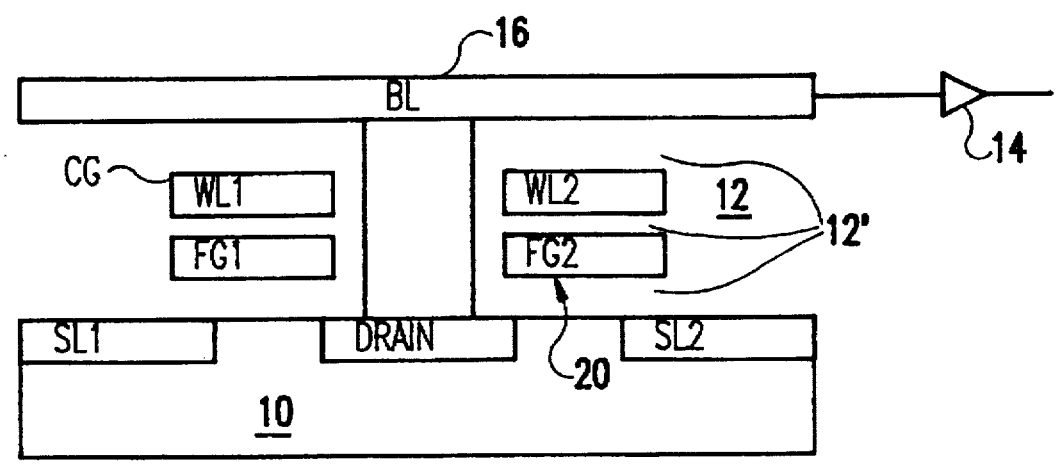
FIG. 1B is a sectional view of the EEPROM of FIG. 1A taken along section 1—1 thereof.
Figure 1C:
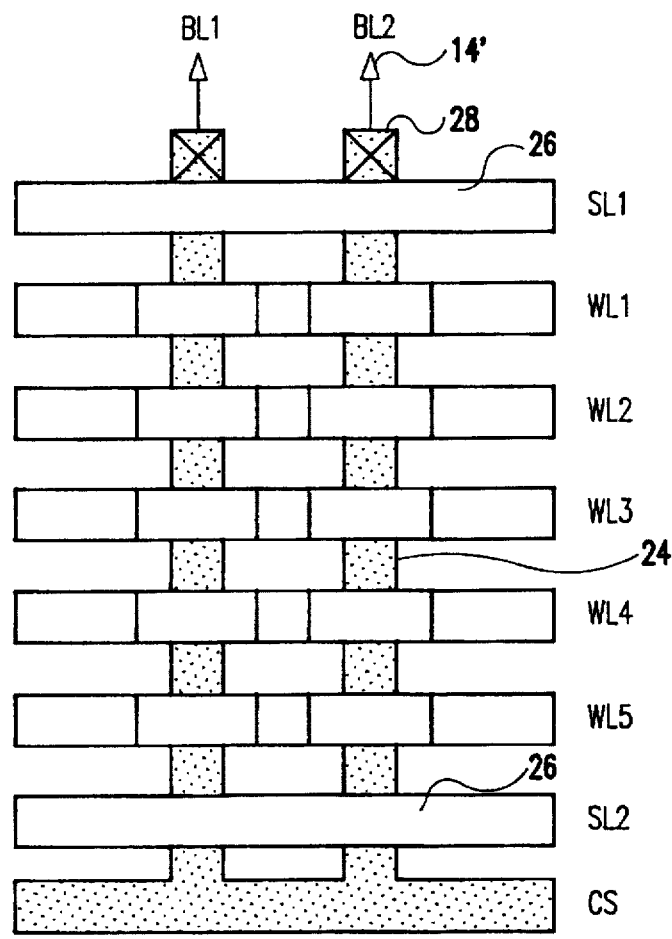

Referring now to the drawings, and more particularly to FIGS. 1A and 1C, there is shown, in plan view, exemplary layouts of NOR-type and NAND-type EEPROMs, respectively, including self-aligned bit line contacts. It is to be understood that the layouts shown in these Figures are arranged to show features of known designs which are important to an understanding of the advantages of the present invention but include self-aligned bit line contacts which are not conventional but illustrated to facilitate comparison with the invention. The self-aligned bit line contact, itself, is not considered to be a part of the invention but can be used with various kinds of array structures, including a conventional NOR array EEPROM, to reduce the area which is required for the contact. No portion of either Figure is admitted to be prior art as to the present invention.

By adopting a self-aligned bit line contact, word lines adjacent to each other and having a common intervening bit line contact (e.g. WL1 and WL2 or WL3 and WL4) can be designed with minimum pitch. However, space is required between word lines and common source lines as alluded to above, in order to avoid overlap which engenders a large parasitic capacitance. Therefore, minimum cell area in a NOR array will be $(2d+2x)*(2d+x)$, where d is a word line or bit line width and x is the minimum required spacing for alignment tolerance. Without use of a self-aligned bit line contact, $(2d+2x)*(2d+3x)$ will be the minimum cell area since additional space to allow for additional alignment tolerance for the contact would be required.

FIG. 1B shows a cross-section of the portion of a NOR-type EEPROM with self-aligned contacts shown in FIG. 1A.

As alluded to above, transistor drains D and common source line SL are generally formed below the surface of substrate, well or layer 10. Overlying the region of the substrate, well or layer 10 between the transistor drains and source line is a layered structure including floating gate FG and a control gate CG overlying the floating gate FG and intervening insulator layers 12', referred to as a gate stack. The control gates of a plurality of transistors are formed as continuous word lines such as WL1 and WL2. After the gate stack is etched in a self-aligned manner to the WL pattern, the source lines SL1 and SL2 and drain diffusions are formed by ion implantation self-aligned to the gate stack and field oxide areas. Annealing after impurity implantation causes diffusion of impurity below the word line, resulting in the slight overlap illustrated. Connections 16 to the drains can then be deposited in a self-aligned manner to form via-like structures. Continuous bit lines such as BL1 and BL2, overlying the insulator 12 and the layered gate stack and connections 16 to the drains of a plurality of transistors are then patterned from a deposited layer.

For a read operation, the bit line is precharged and a selected word line is forced to a read voltage (i.e. 5 volts) and the common source line is connected to ground. If the floating gate charge (e.g. on FG1) is sufficiently positive that the transistor can conduct a current, the precharge voltage on the bit line will drop and the voltage drop detected by sense amplifier 14. If the floating gate voltage is sufficiently negative to prevent conduction, the bit line voltage is not changed and the sense amplifier state (preferably also precharged) will not change or be driven to the opposite state by the bit line precharge voltage.

During program or write operation, as alluded to above, FN injection cannot be used for a conventional NOR array because the source line runs parallel to the word line and the write voltage cannot be selectively applied to a unique cell of the array for that reason. Accordingly hot electron injection must be used to obtain selectivity. During erasure, it is common to apply a high voltage to the common source line for flash erase. Since the common source line is connected to cells associated with a pair of adjacent word lines, blocks having a common source line become the minimum unit of flash erasure.

FIG. 1C shows a NAND-type EEPROM architecture for purposes of comparison with the layout of the NOR type array discussed above and illustrated in FIG. 1A. In this illustration, self-aligned contacts are also shown although not conventional in the art. In this case, conduction channels 24 of the array are preferably formed in an impurity well in the substrate and bit line connections 28 are formed external to the array. A cell of a NAND type array can thus be made very small $((2d+x)*2d)$ since no connections need be made within the array. As peripheral elements select transistors 26 are formed under one or two select lines (e.g. SL1 and SL2). A common source line connection CS is connected to the ground line during a read operation. Bit lines BL1, BL2 are connected to respective sense amplifiers as depicted at 14' formed external to the array. Since many word lines can be provided, the peripheral elements require only a small fraction of the memory structure chip area and are located entirely outside the cell array. Full selectivity among transistors of the array is provided by voltages applied to word lines WL1, WL2, WL3 ... WLn and select transistors 26 formed at SL1, SL2 at ends of the array to define an array block of the memory cells thus enclosed.

For a read operation, all bit lines connected to the selected array block are precharged. In the selected array block, all WL and SL are forced to a read voltage (e.g. 5 volts to allow conduction regardless of charge storage state) except for the selected word line, which is forced to, for example, ground. If the selected cell conducts current because of sufficient positive charge on the floating gate, BL is discharged by a current from the bit line contact 28 to common source line CS and the voltage drop is detected by the sense amplifier 14' as low. If the floating gate is sufficiently negative to suppress the discharge current, no voltage drop occurs and the precharge voltage is detected by the sense amplifier as high.

While a NAND type array may provide advantages in potential integration density, one drawback is the relatively long bit line discharge time due to the capacitance of the bit line in combination with the relatively high resistance of the series connected transistors of the individual memory cells along a bit line. Accordingly, read access time is often more than 10 μsec. For NAND type memories of increased capacity, the number of memory cells or transistors in series must be increased, thus compromising read access time.

In a program or write operation, the NAND type array generally uses a voltage difference between the channel and the word line. For the selected array block, SL1 and unselected word lines are forced to a mid-level voltage (e.g. $V_{mid}$=10 volts) and SL2 is forced to ground to disconnect the array from CS. To control the channel voltage, the bit line voltage is selectively applied. That is, the selected bit line is forced to ground while the unselected bit lines are forced to $V_{mid}$. These voltages are transmitted to all cells by the diffusions under SL1 and the word lines. The selected word line is forced to a high voltage (e.g. $V_{high}$=20 volts). Thus, the high voltage is only applied between the channel and the word line of the selected cell. All other cells see either $V_{mid}$ (if half-selected) or no voltage at all between the channel and the word line. The cell devices are designed such that $V_{mid}$ is insufficient to develop sufficient FN current to charge the floating gate FG and a current sufficient for the purpose will be developed at $V_{high}$.

This particular set of voltages thus provides the greatest possible operating margins but forces programming from the side of the array adjacent SL2 in order toward SL1 since a programmed cell will have a conduction threshold $V_t$ greater than $V_{mid}$. The maximum voltage which can be conducted by a cell transistor is $V_{gate}-V_t$. Therefore, to conduct $V_{mid}$ along the bit line to the selected cell, $V_t$ must be zero or negative since $V_{gate}$ is also $V_{mid}$. In essence, this requires all data in a block (or at least between the selected cell and BL) to be erased and rewritten in order when any data in the block is to be changed.

Flash erasure is relatively less complicated. To extract electrons from the floating gate, the substrate and the impurity well in which the array is preferably formed are forced to $V_{high}$. Diffusions within the well are thus positively biased and will be at a voltage close to $V_{high}$. Word lines for the selected block are forced to ground while word lines of unselected blocks are allowed to float or forced to $V_{high}$. The peripheral circuits are outside the array and the impurity well in which the array is preferably formed and are preferably protected by being formed in separate impurity wells to which $V_{high}$ is not conducted and which may be forced to ground. If the device is fabricated using CMOS technology, a further impurity well must be provided within the protective impurity well in order to form transistors of complementary conductivity types.

Figure 1D:
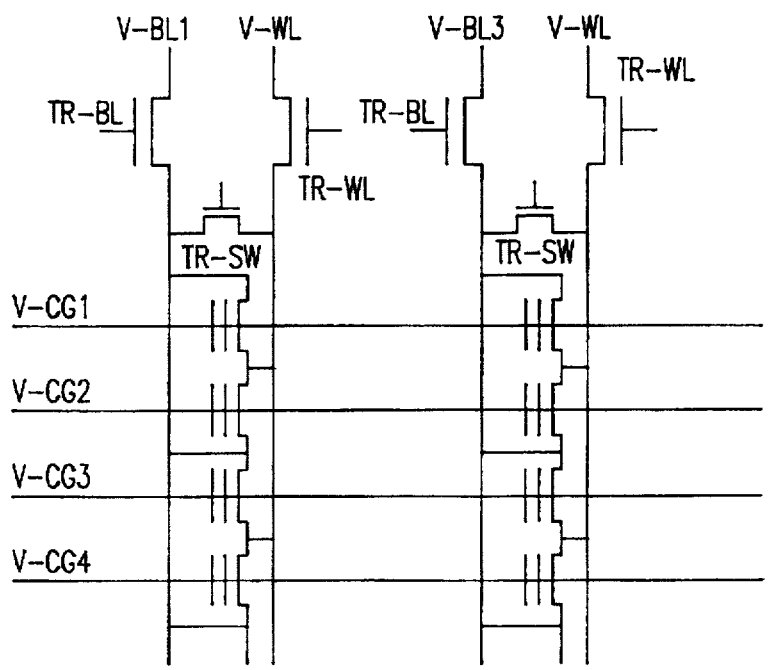
FIG. 1D is a schematic diagram of a preferred layout of an EEPROM in accordance with the invention.

A schematic diagram of the EEPROM in accordance with the present invention is shown in FIG. 1D. The basic distinction between the layout of the EEPROM exemplified in FIG. 1A and that of the invention is that the common source line runs in the same direction as the bit lines and orthogonal to the control gate/word lines in FIG. 1D. This cannot be done in the EEPROM architecture of FIG. 1A. In order to connect transistor sources in a column as shown in FIG. 1D using conventional wiring techniques another metal line running parallel to the bit line would be required and would increase the minimum cell size in a NOR type EEPROM layout beyond that of the layout of FIG. 1A even though a lateral spacing (e.g. in plan view) must be maintained between the word lines and common source lines therein and registration tolerances accommodated.

Figure 2:
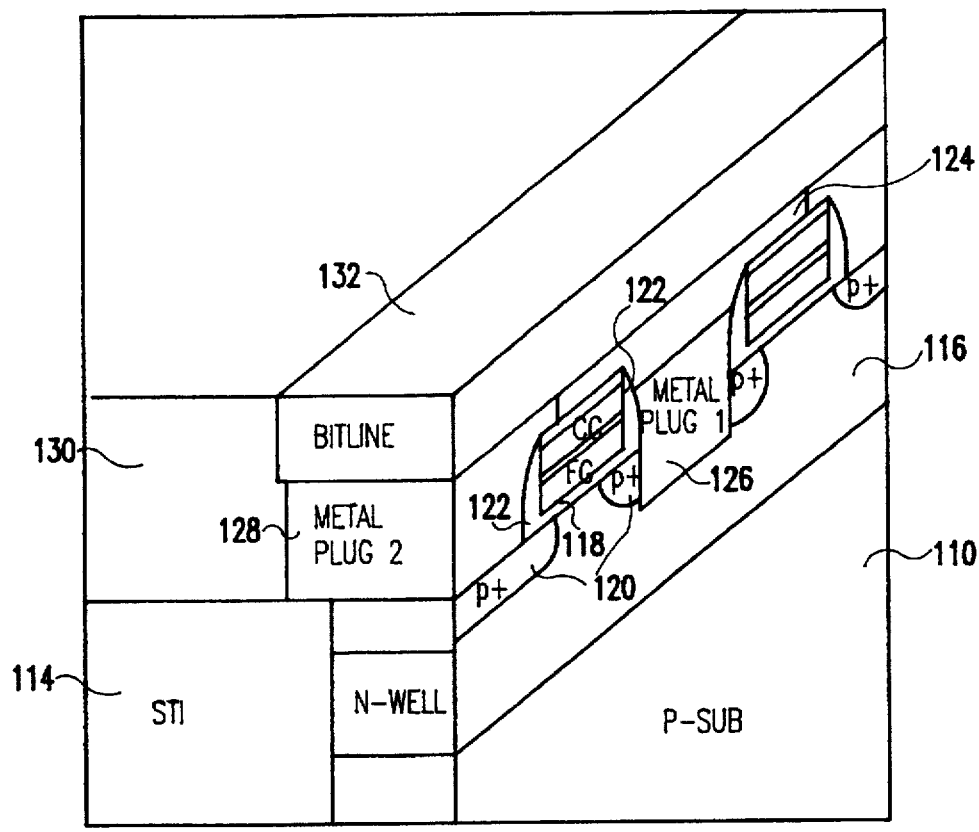
FIG. 2 is an isometric cut-away view of a pair of EEPROM memory cells exemplary of the invention.

This constraint is avoided and numerous advantages obtained in the present invention by the formation of a plurality of parallel elongated conductors, preferably as n-wells, at minimum feature size which are isolated from each other, preferably by shallow trench isolation, to confine transistors to only the intersections of the bit lines and word lines, as will become evident from FIG. 2. Additionally, the voltage of each n-well can be independently controlled to provide selectivity and permit Fowler-Nordheim tunnelling, precluded by the common source line of the architecture of FIG. 1A.

Referring now to FIG. 2, an isometric cutaway view of an exemplary memory cell in accordance with the present invention is shown. The EEPROM in accordance with the present invention preferably uses a p-type substrate 110 in which an array of linear shallow trench isolation (STI) structures 114 are formed with narrow n-wells 116 interposed therebetween by conventional lithographic methods. It is preferred to form the STI structure first to allow planarization prior to lithographically forming a mask for masked implantation to a shallower depth to form the n-wells. A layered structure including a plurality of floating gates FG and control gate/word line CG separated from the n-well and each other by layers of insulator such as oxide, nitride or a composite is also formed in a conventional manner. The floating gates and gate insulator 118 are formed in strips slightly larger than the active area defined by the n-wells. After another layer of insulator (e.g. ONO) and the control gate polysilicon are deposited, the control gates are patterned. The etch process for patterning the control gates also etches the insulator between the floating gate and the control gate and the floating gate as well; gate insulator 118 functioning as an etch stop for the process. Thus floating gates are limited to the area covered by the control gate lines. Source and drain implantations and sidewalls can be done self-aligned to the control gate pattern (including lightly doped drain (LDD) structures, if desired) in a conventional manner.

Another feature of the preferred form of the present invention which favors increase of integration density is the formation of metal plug connections to the n-well and the bit line in a self-aligned manner. Self-alignment, of course, does not require allowance for registration tolerances and permits the metal plugs 126 and 128 to be formed at sub-lithographic sizes. It will be recalled that the bit line connections in FIG. 1A were limited to lithographic minimum feature size and enlarged pads 18 were required to accommodate alignment tolerances.

Metal plug 1 is formed by a two step etch process, beginning with a RIE oxide etch self-aligned to the control gate conductor which is preferably metal. Another mask is then applied which preferably has openings only in the cell array area and the silicon is further etched to a desired depth and metal deposited to form metal plug 126. Then a blanket layer of insulator 124 (which can be selectively etched without significant etching of the insulator and sidewalls covering the control gate) is deposited, planarized and patterned. Alignment is not critical since further etching to form an aperture for deposition of metal plug 128 is self-aligned with the sidewall 122. The bit line 132 can be applied as a blanket metal or polysilicon layer thereover and patterned and insulator 130 deposited. Again, alignment is not particularly critical since metal plug 128 will form a reliable contact to the bit line and the transistor drain and, since the bit line is at least of minimum feature size in width and both metal plug 128 and bit line 132 can overlap the shallow trench isolation to some degree, as illustrated, substantial accommodation of registration tolerances is inherent as a meritorious effect of the invention.

Figure 3:
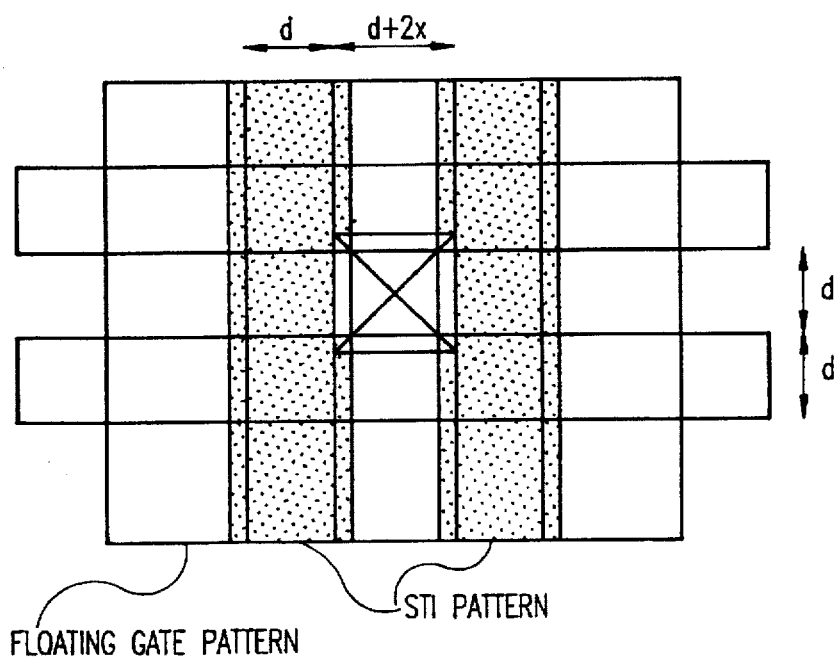
FIG. 3 is a schematic play view of a memory cell in accordance with the invention, FIG. 4 graphically illustrates voltage changes in different operational modes of the invention.

A plan view of the resulting memory cell is shown in FIG. 3. Since the common source line now runs below the bit line rather than parallel to the control gate/word line as in FIG. 1A and the transistors are confined to the n-wells by the STI, no additional space need be allocated to either the common source line or the clearances and accommodation of registration tolerances, allowing minimization of memory cell size. As shown in FIG. 3, the lithographically dependent clearance x (which must include registration tolerances in the architecture of FIG. 1A) is reduced to the thickness of the sidewalls on the transistor structures and partially compensated (in the direction of the n-well length) by the sub-lithographic dimensions of the self-aligned metal plugs. Therefore, the total memory cell size for the NOR-type array in accordance with the invention may be reduced to 2d(2d+2x) which compares very favorably with the cell size of the NAND-type EEPROM of FIG. 1C while allowing parallel writing for increased average writing speed (in addition to the inherently faster read response time of NOR-type EEPROM architectures—under 70 nsec).

Additionally, the invention provides two further functions which enhance durability. It will be recalled from the discussion of FIG. 1B that extraction of electrons from the floating gate causes concentration of current at an edge of the gate oxide, increasing damage in that region. Such concentration of hot electrons is avoided in the present invention by the capability of connecting the source and drain to each other and to receive the same voltage. Further, in the present invention, as shown in FIG. 1D the bit line and the n-well can be connected together during programming (e.g. selective write or erase in accordance with data) or flash erase. The connection of the bit line and the n-well thus avoids generation of hot hole current for either writing or erasure and whether erasure is performed selectively or not, thus reducing damage to the gate oxide relative to that inherent in known EEPROM architectures. Durability of memory cells in accordance with the invention should thus be raised to approximately $10^6$–$10^7$ write and erase cycles due, in large part, to the avoidance of concentration of electron current and generation of hot hole current, particularly in combination.

It should be noted that a simple calculation can demonstrate this level of durability is effectively unlimited at performance levels comparable to currently available hard disks. Assuming, for example emulation of 256 Megabytes of disk space with eight 256 Megabit EEPROMs and a writing burst rate of 20 Megabytes per second the entire memory storage space would require 12.8 seconds to write the entire memory. Therefore, writing over the entire memory $10^7$ times would require $1.28 \times 10^8$ seconds or about four years prior to failure even without accounting for intervening erase operations. This period of time is longer than the period of obsolescence of processors at the present rate of technological development and also represents a worst case which is not at all representative of a realistic mode of memory operation since such a data burst rate is not, in fact, maintained during normal processor operation.

Further, larger memory capacity would proportionally reduce the number of write and erase cycles which would be performed in a given period. Therefore, the durability of the EEPROM memory cells in accordance with the invention can be considered as effectively unlimited as long as writing and erasure is distributed to a reasonable degree over the memory capacity.

Further, it should be noted, as alluded to above, that the ability of the present invention to connect the bit line and n-well during writing and erasure, whether selective or non-selective, provides an additional advantage of flexibility in programming and flash erasure. Specifically, consider the following table of voltages applied to various terminals of a memory cell.

In the table, prog1 refers to selective injection of electrons into FG, prog2 refers to selective extraction of electrons from FG, erase1 refers to non-selective injection of electrons into FG and erase2 refers to non-selective extraction of electrons from FG. It should be noted that the existence of both erase1 and erase2 represents a functionality not available in the architectures of either FIG. 1A or 1C. Both functions are provided by the invention without such concentration of hot electrons. By the same token, both prog1 and prog2 are not necessarily provided in known EEPROM architectures, particularly flash EEPROMS which typically operate in an erase-before-write mode.

TABLE 1

| Operation | prog1 | prog2 | erase1 | erase2 | read |
| --- | --- | --- | --- | --- | --- |
| VCG1 (sel) | H | L | H | L | L |
| VCG2 (unsel) | M | M | H | L | Vcc |
| VBL1 (sel) | L | H | L | H | R |
| VBL2 (unsel) | M | M | L | H | R |
| Vwell | N/A | N/A | N/A | N/A | Vcc |
| TR-SW | On | On | On | On | Off |
| TR-BL | On | On | On | On | On |
| TR-well | Off | Off | Off | Off | On |

In the above table, L is, for example, ground potential, H is a voltage sufficient to cause Fowler-Nordheim tunnelling, M is an intermediate voltage therebetween, Vcc is power supply voltage and R is a voltage slightly below Vcc (e.g. Vcc−1.5 v) for reading operations.

Note that for both non-selective erase1 and erase2 operations, the bit line and the n-well are connected since TR-SW is on and the bit line voltage is either low or high when the control gate voltage is high or low, respectively. Thus flash erase operations erase1 and erase2 are symmetrical and complementary and can be performed to bring all memory cells of the array or a partition thereof to either a "1" or a "0" state. Prog1 and prog2 are similarly symmetrical and complementary.

This capability provides, as a perfecting feature of the invention, a mode of operation wherein the durability of the memory cells can be doubled. Consider for example that the array is initially in a state in which each cell contains a "0". It is immaterial to this discussion whether "0" is represented by storage or lack of electrons on the floating gate FG of a cell. Then, for example, the byte 0011010100010101 is programmed into the memory in the normal manner. When it is desired to reprogram that byte, for example, to 1110100001010100, the byte could be flash erased (or selectively programmed) to a 1111111111111111 state prior to programming the byte 1110100001010100. Note that two selective programming operations have been performed during a single write and erase cycle of each cell and writing and erasure will have occurred exactly once for each cell of the byte. Further, it should be understood that the erasure need not take place during a clock-defined memory cycle but can be done in a background memory operation. It does not matter if either or both of the programmed bytes represent the true or complement of the data or instruction represented but it is considered that the encoder/decoder to support such an operation, the design of which is not critical to the practice of the invention and suitable designs will be apparent to those skilled in the art, might be most simply designed by designating an arbitrary bit (e.g. the first bit of the byte) as a flag indicative of the portion of the write erase cycle in use at any given time (e.g. the state of the memory cells resulting from the most recent flash erase) and storing data as a complement following either erase1 or erase2. Using a two bit status flag would allow all "0" and all "1" signals to be distinguished from the erased state.

The flag bit or bits then can be used to determine which of erase1 and erase2 is to be used during the next flash erase. In addition, the amount of current passing through the oxide becomes half of the current used for block erase when the cells are returned to a consistent state by flash erase. Thus, while not necessary to the successful practice of the invention to provide numerous meritorious effects, this particular mode of operation essentially doubles the durability of the memory cells and complements the distribution of write and erase operations over the full memory capacity within individual bytes of memory.

Figure 4:
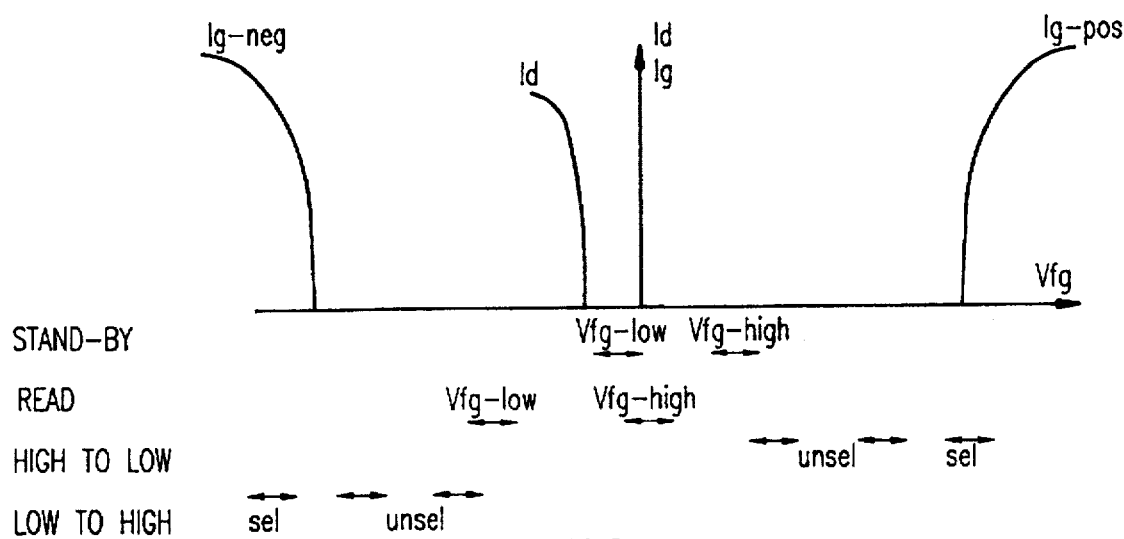

Referring now to FIG. 4, the floating gate voltage ranges and resulting relative currents are illustrated for each of several operational modes of the invention. Specifically, in the stand-by mode, $V_{FG}$ are near ground potential, regardless of charge storage state so that all transistors are off. In the read mode, the n-well transistor is turned on and the bit line and n-well disconnected by turning off TR-SW and turning on TR-well. A selected control gate is forced low (e.g. ground) as indicated in Table 1 which shifts the FG voltages controlling conduction in the n-well. Thus, only cells in which electrons are stored will be turned on and the bit line voltage R is sensed by a sense amplifier.

For prog1 and erase 1 which is a high to low transition of cell state, selected control gates (or all control gates for erase1) are raised to voltage H. Selected (or all) bit lines are forced to L while unselected bit lines are forced to voltage M. Therefore only selected (or all) cells have a sufficiently high field across the gate oxide to cause Fowler-Nordheim tunnelling and cause a transition of the FG voltage from high to low with resulting positive gate current Ig. Cells already in the low state do not change voltage and unselected cells do not have a sufficiently strong field across the gate oxide to cause Fowler-Nordheim tunnelling. For prog2 and erase2 which are both low to high transition operations, the operations are precisely the same except the H and L voltages are interchanged to extract electrons from selected cells which are not already in the high state.

Figure 5:
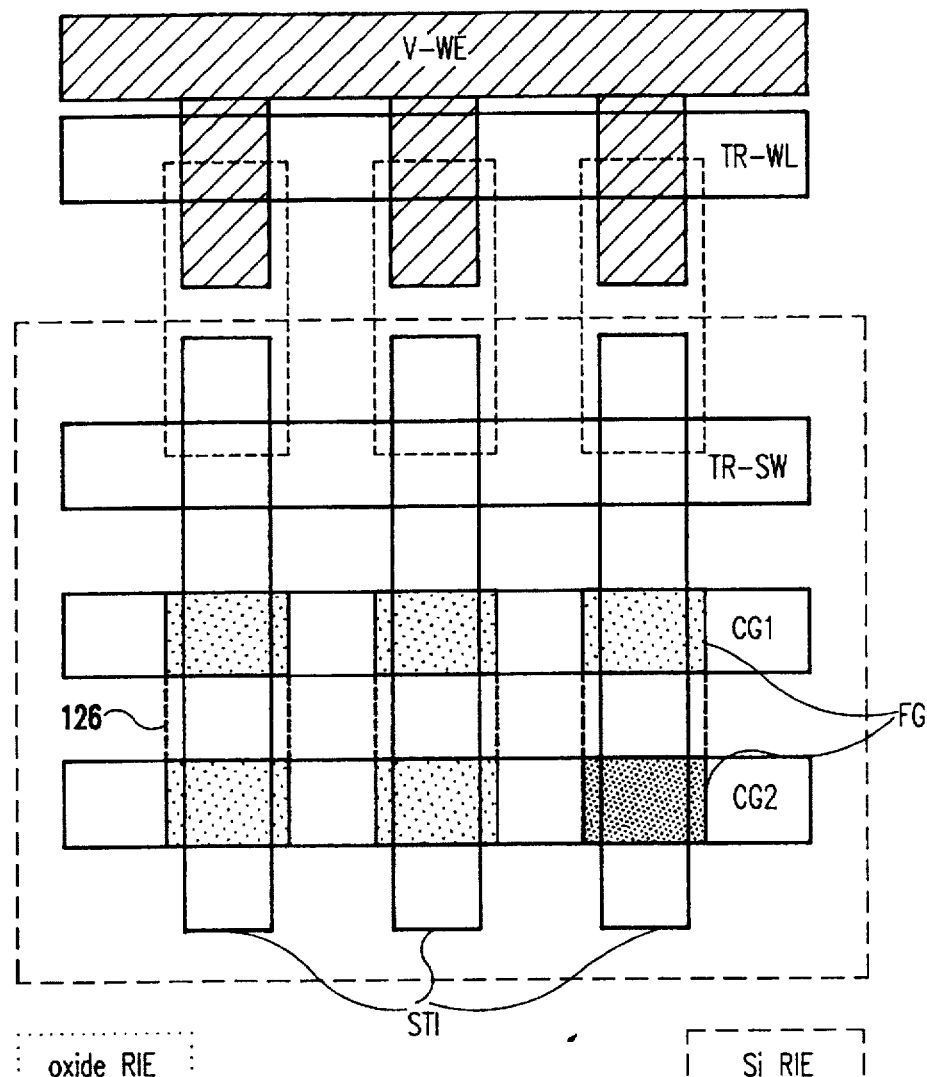
FIG. 5 is a partial plan view of the well voltage control arrangement in accordance with the invention.

Referring now to FIG. 5, the preferred embodiment of the invention is shown in plan view to clearly show the layout thereof, including the transistors providing control of the voltage applied to the N-well. The bit lines, bit line transistors and metal plugs 128 are omitted from FIG. 5 in the interest of clarity. The bit line transistors can be formed similarly to the well control switching transistors TR-WL by the application of the metal plug process but it is generally preferable that such transistors be formed as a part of the bit line decoder (not shown) and located outside the memory array. However, metal plug 126 connections to the n-well as shown by dashed lines and it should be understood that metal plugs 128 are placed between the gate electrode for transistor TR-SW and CG1 and between alternating control gate electrodes across the array (e.g. after even numbered control gate electrodes. By virtue of the metal plug interposed between TR-SW and CG1, The transistor TR-SW is capable of connecting the n-well to the bit line in order to bring the n-well, source and drain of all transistors to the same potential for electron tunnelling, whereby uniform injection or extraction of electrons over the gate oxide 118 decreases oxide degradation.

A portion of the process for fabricating the array allowing for formation of the well control transistors has been described above as a two-step reactive ion etch process. This two-step etch process is important to the practice of the preferred form of the invention for formation of the memory cell array in combination with the switching transistor array, as will now be described with reference to FIGS. 6A-6D.

Figure 6A:
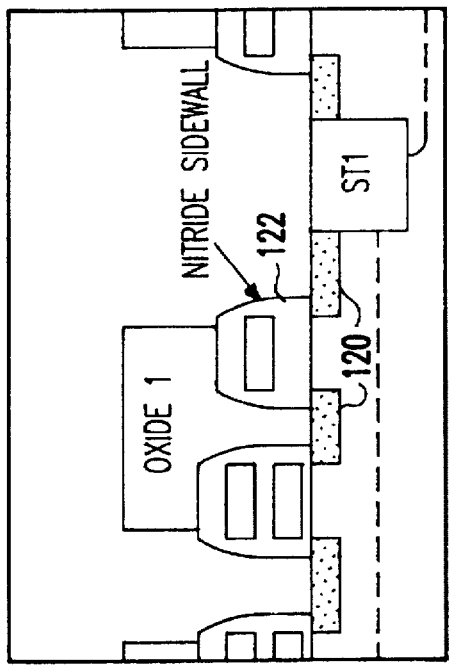
FIGS. 6A, 6B, 6C and 6D are cross-sectional views of a portion of the invention at the edge of the storage array illustrating formation of metal plugs and bit lines in accordance with the invention.
Figure 6B:
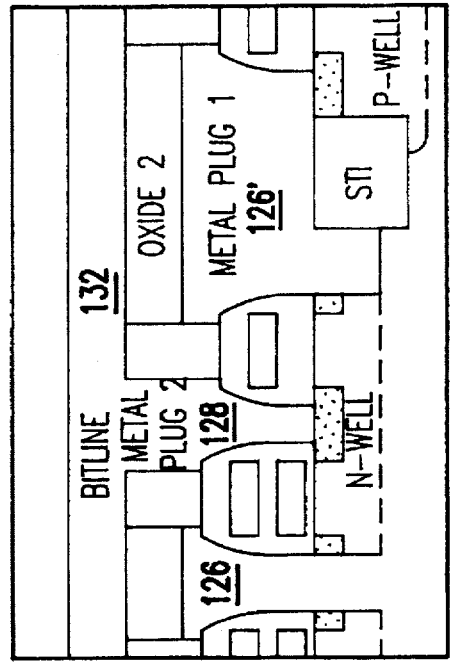

After completion of the memory array gate conductors CG and the gate conductors for TR-SW and TR-WL, preferably with nitride caps thereover, and forming the sources and drains, preferably by self-aligned (to the transistor gates and memory cell gate stacks) ion implantation and diffusion, as shown in FIG. 6A, the transistors are covered with an interlayer dielectric which is preferably nitride for etch selectivity. Nitride is then deposited to form sidewalls on the layered FG/CG gate stack structure and the gates of transistors TR-SW and TR-WL. A blanket layer of oxide is then deposited over the structure and preferably planarized.

Figure 6C:
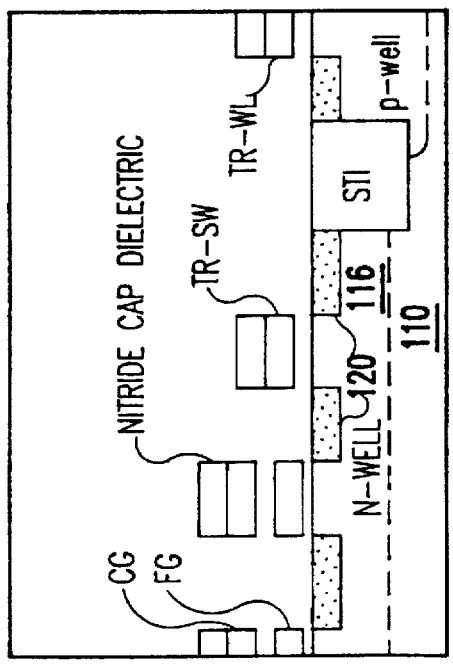
Figure 6D:
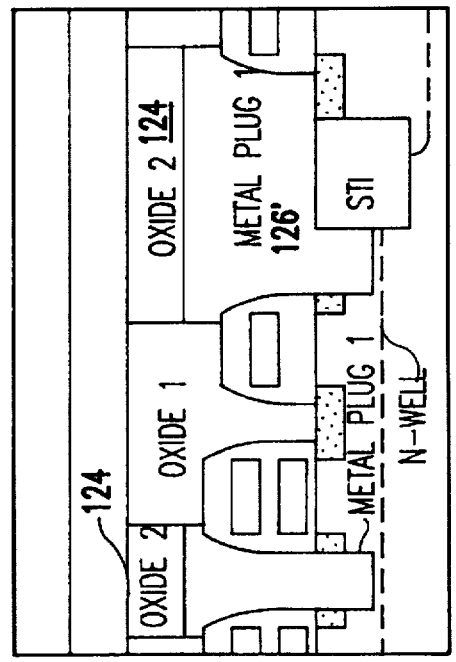

To then form metal plug 126 (FIG. 2) RIE of the oxide is performed to pattern the oxide between pairs of memory cell transistors and over the STI separating the memory cell array n-well from the p-well in which TR-WL is formed to a depth within the silicon surface of the n-wells in the substrate. It should be noted that the p-well may preferably extend farther into the substrate than the n-well. This RIE is considered to be self-aligned since it is largely anisotropic and leaves the nitride sidewalls on the layered FG/CG structure substantially intact. This RIE is applied not only to the transistors of the memory array but also to the diffusion regions of transistors TR-WL and TR-SW. After the oxide is etched, the resist for the oxide RIE is removed and metal deposited on the silicon and nitride within the apertures etched in the oxide, as shown in FIG. 6C and patterned by etch back. Alternatively, selective deposition of metal is possible. A protective oxide 124 is then formed over the metal plugs 126 and 126', the latter forming a connection between TR-SW, the n-well and TR-WL. Then, as shown in FIG. 6D, another block-out resist applied and patterned with a mask only in area of the memory cell array and the TR-SW transistors but not for TR-WL. A further layer of metal can now be deposited and patterned to form metal plugs 128 and bit lines 132. This deposition is also similarly considered to be self-aligned to the nitride sidewalls of TR-SW and the array transistors which remain after the selective RIE of oxide.

In view of the foregoing, it is seen that the EEPROM in accordance with the invention provides an electronic storage device particularly suitable to the formation of a solid state file and particularly for emulation of hard disk mass storage in data processing systems. The EEPROM can be manufactured at extremely high integration density to greatly reduce cost per memory cell by virtue of using narrow n-wells running in the direction of the bit lines and separated by shallow trench isolation. Read operations can be performed in less than 70 nsec. by virtue of its NOR-type architecture while permitting selectivity by virtue of the n-well layout without selectively generating a hot electron current so that Fowler-Nordheim tunneling can be utilized. The fast read operation access time supports direct execution mode operation in which instructions and data can be accessed directly from the EEPROM by a processor without first being transferred to random access memory (e.g. DRAM). Low current Fowler-Nordheim tunnelling increases durability and permits simultaneous programming of hundreds of memory cells within the capacity of normal power supplies to emulate high burst data rates in excess of 2 Mbits per second. Further, by providing for selective connection of the bit lines and n-wells (particularly in the preferred layout), concentration of hot electron current is unconditionally avoided during both write and erasure and whether selective or non-selective to increase cell durability to in excess of $10^6$ to $10^7$ write and erase cycles. Cell size is reduced to only slightly in excess of four times the minimum lithographic feature size, particularly by formation of self-aligned metal plugs in combination with the n-well/STI layout. Thus storage capacity, access time and data burst rates favorably comparable to currently available magnetic storage media are provided in a solid state memory structure by the invention. Read access time compares favorably with currently available DRAM. Moreover, the symmetry and complimentarily of these operations allows a mode of operation, as a perfecting feature of the invention, in which the memory can be programmed twice within a single write and erase cycle to double the cell durability which is otherwise greatly enhanced in accordance with the invention.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An electrically erasable programmable read only memory (EEPROM) comprising a substrate, a plurality of elongated conductors formed within said substrate at a surface thereof, a plurality of layered structures extending orthogonally to said elongated conductors, said layered structures including a floating gate at an intersection of said layered structure with one of said elongated conductors and a control gate electrode overlying but insulated from each said floating gate, said layered structure defining a memory transistor at each said intersection, and a bit line overlying said layered structure and extending in the direction of said elongated conductors.

2. An EEPROM as recited in claim 1, further including means for preventing concentration of hot electron current between said elongated conductor and said floating gate.

3. An EEPROM as recited in claim 2, wherein said means for preventing concentration of hot electron current comprises means for selectively connecting one of said elongated conductors to a corresponding bit line overlying said one of said elongated conductors.

4. An EEPROM as recited in claim 1, wherein each said transistor includes a source and a drain, and wherein at least one of a connection of a bit line to a drain and a connection of said elongated conductor to a source comprises a metal plug.

5. An EEPROM as recited in claim 4, wherein said metal plug is self-aligned to said layered structure.

6. An EEPROM as recited in claim 1, further including means for programming a plurality of memory cells of said EEPROM simultaneously.

7. An EEPROM as recited in claim 1, wherein said EEPROM is of NOR-type architecture.

8. An EEPROM as recited in claim 1, wherein said substrate is of the p-type and each of said elongated conductors comprises an n-well.

9. An EEPROM as recited in claim 3, wherein said means for connecting said bit line and said elongated conductor includes a transistor and a metal plug.

10. An EEPROM as recited in claim 2, further including means for performing flash erase of a partition of said EEPROM to either of two logical states without concentration of hot electron current.

11. A method for operating an EEPROM including the steps, in sequence, of changing the logical states of a selected memory cell of a partition of said EEPROM from a first logical state to a second logical state in accordance with data, changing logical states of remaining cells of said partition of said EEPROM such that all cells of said partition are of a second logical state, changing the logical states of a selected memory cell of said partition of said EEPROM from a second logical state to a first logical state in accordance with data, and changing logical states of remaining cells of said partition of said EEPROM such that all cells of said partition are of a first logical state.

12. A method for operating an EEPROM as recited in claim 11, wherein said steps of changing logical states of all cells of a partition of said EEPROM to a second logical state and changing logical states of all cells of a partition of said EEPROM to a first logical state are performed non-selectively as a flash erasure.

* * * * *